US010056151B1

(12) United States Patent
Vining

(10) Patent No.: US 10,056,151 B1
(45) Date of Patent: Aug. 21, 2018

(54) MULTI-READ ONLY MEMORY FINITE STATE MACHINE

(71) Applicant: Texas Instruments Incorporated, Dallas, TX (US)

(72) Inventor: Suzanne Mary Vining, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/612,934

(22) Filed: Jun. 2, 2017

(51) Int. Cl.
*G11C 16/28* (2006.01)
*G11C 16/32* (2006.01)
*G11C 17/12* (2006.01)

(52) U.S. Cl.
CPC .............. *G11C 16/28* (2013.01); *G11C 16/32* (2013.01); *G11C 17/12* (2013.01)

(58) Field of Classification Search
CPC ......... G11C 16/28; G11C 16/31; G11C 17/00; G11C 17/08; G11C 17/10; G11C 17/12; G06F 9/30174; G06F 9/30189; G06F 9/30076; G06F 9/3017; G06F 12/0811; G06F 13/1663; G06F 13/1694; G06F 15/8069
USPC ................... 365/103, 189.07, 49.17, 49.1, 94
See application file for complete search history.

(56) References Cited

U.S. PATENT DOCUMENTS

| | | | | |
|---|---|---|---|---|
| 6,097,721 A * | 8/2000 | Goody | ....................... | H04J 3/08 370/230.1 |
| 6,400,715 B1 * | 6/2002 | Beaudoin | ................ | H04L 49/25 370/392 |
| 7,019,998 B2 * | 3/2006 | Tran | ..................... | G11C 11/5642 365/185.21 |
| 2006/0062036 A1 * | 3/2006 | Ng | ......................... | G11C 15/00 365/49.17 |
| 2011/0238917 A1 * | 9/2011 | Lin | ...................... | G06F 9/3804 711/125 |
| 2013/0185545 A1 * | 7/2013 | Lin | ..................... | G06F 9/30043 712/225 |
| 2014/0126381 A1 * | 5/2014 | Yang | ....................... | H04L 43/12 370/241 |
| 2016/0035399 A1 * | 2/2016 | Yaraduyathinahalli | .. | G11C 7/10 365/189.17 |

* cited by examiner

*Primary Examiner* — Tan T. Nguyen
(74) *Attorney, Agent, or Firm* — John R. Pessetto; Charles A. Brill; Frank D. Cimino

(57) ABSTRACT

A multi-read only memory (ROM) state machine circuit includes first and second ROMs (or other memory types), each ROM addressable as a plurality of rows. Each row of the first ROM includes a pointer. Each row of the second ROM includes a set of input compare bits and a next state identifier. A comparator circuit compares each input bit to the state machine circuit to a corresponding bit of the set of input compare bits from the second ROM. A register stores next state identifiers from the second ROM based on the comparator's outputs. Upon receipt of a clock edge, the stored next state identifier from the register is used an address to read a row from the first ROM. The pointer from the first ROM row is then used as an address to read a row from the second ROM. Responsive to the comparator circuit, the next state identifier corresponding to a set of input compare bits that match the input bits to the finite state machine circuit is stored in the register and used as an address to read another row from the first ROM.

20 Claims, 5 Drawing Sheets

MULTI-READ ONLY MEMORY FINITE STATE MACHINE

BACKGROUND

Multiple techniques are available for implementing programmable functionality in an electronic system. Microcontrollers can be used which execute firmware stored in memory. Field programmable gate arrays also can be used. Both of the types of implementations are relatively large and costly solutions and consume large amounts of power.

SUMMARY

In accordance with at least one embodiment, a multi-read only memory (ROM) state machine circuit includes first and second ROMs, each ROM addressable as a plurality of rows. Each row of the first ROM includes a pointer. Each row of the second ROM includes a set of input compare bits and a next state identifier. A comparator circuit compares each input bit to the state machine circuit to a corresponding bit of the set of input compare bits from the second ROM. A register stores next state identifiers from the second ROM based on the comparator's outputs. Upon receipt of an edge of the clock, the stored next state identifier from the register is used an address to read a row from the first ROM. The pointer from the first ROM row is then used as an address to read a row from the second ROM. Responsive to the comparator circuit, the next state identifier corresponding to a set of input compare bits that match the input bits to the finite state machine circuit is stored in the register and used as an address to read another row from the first ROM.

In accordance with another embodiment, a system includes a multi-memory device finite state machine circuit including a first memory device, a second memory device, and a comparator circuit. The first memory device is addressable as a plurality of rows, each row including a pointer. The second memory device also is addressable as a plurality of rows, each row including a set of input compare bits and a next state identifier. The comparator circuit is coupled to the second memory device and is configured to compare each of a plurality of input bits to the multi-memory device finite state machine circuit to a corresponding bit of the set of input compare bits from the second memory device. Upon receipt of a clock signal, a next state identifier read from the second memory device is used as an address to read a row from the first memory device. A pointer from the first memory device row is then used to read a row from the second memory device. Responsive to the comparator circuit, the next state identifier corresponding to a set of input compare bits that match the input bits to the multi-memory device finite state machine circuit is used as an address to read a row from the first memory device.

Yet another embodiment is directed to a method. The method includes reading a first row of a first read only memory (ROM) using a first set of next state bits from a second ROM as a read address, the first row including a pointer to the second ROM. The method further includes reading a row of the second ROM using the pointer from the first row of the first ROM, the row of the second ROM including a second set of next state bits. The method also includes reading a second row of the first ROM using the second set of next state bits from the second ROM as a read address.

BRIEF DESCRIPTION OF THE DRAWINGS

For a detailed description of various examples, reference will now be made to the accompanying drawings in which.

DETAILED DESCRIPTION

Figure 1:
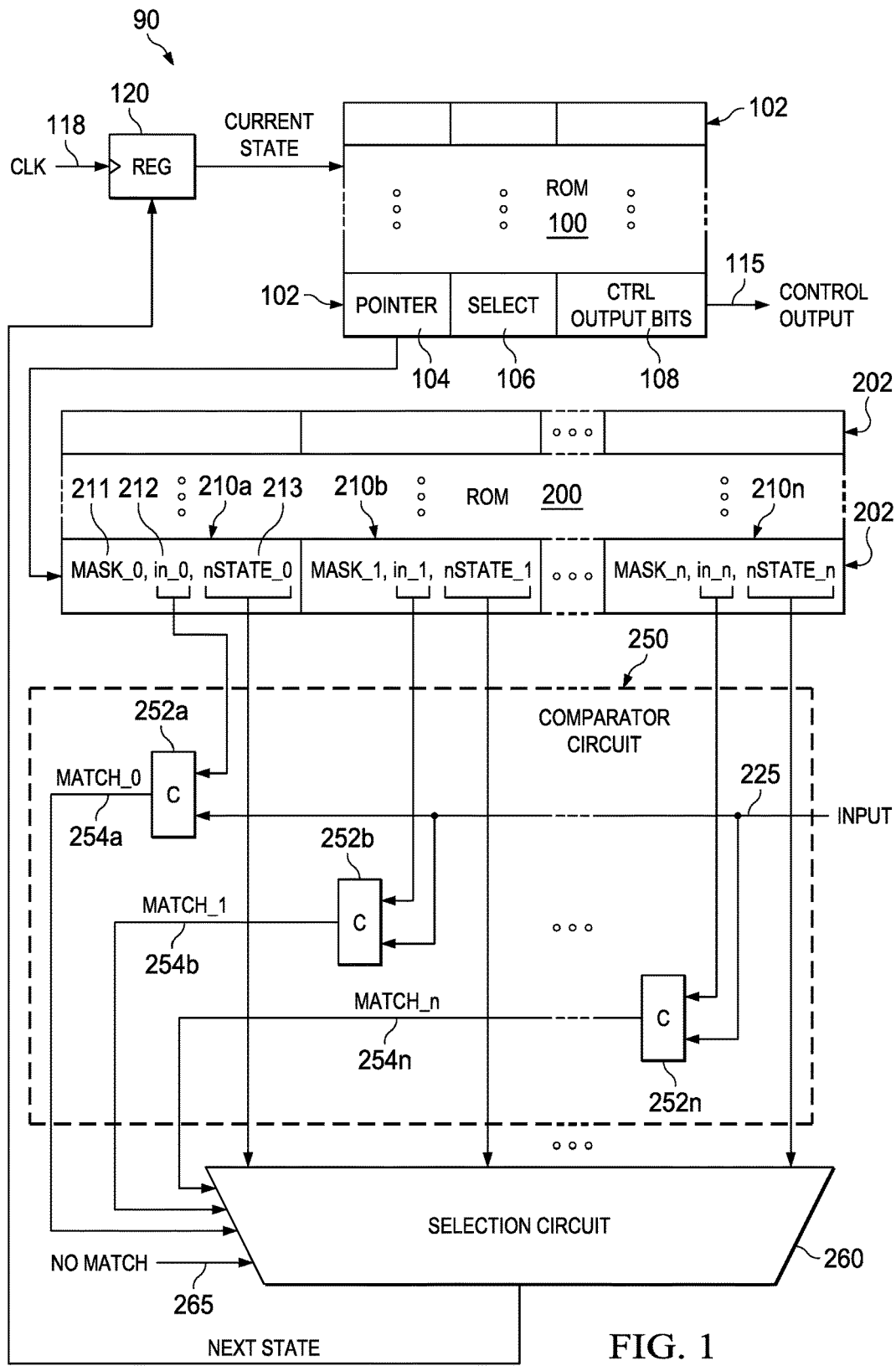
FIG. 1 shows an example of a multi-read only memory (ROM) state machine circuit in accordance with various examples.

The embodiments described herein are directed to finite state machine circuits that include more than one read only memory (ROM), or other type of memory device. FIG. 1, for example, shows an example of a two-ROM implementation of a finite state machine (FSM) circuit 90. The illustrative finite state machine circuit 90 of FIG. 1 includes ROM 100 coupled to ROM 200. The circuit 90 also includes a register 120, a comparator circuit 250, and a selection circuit 260. ROM 100 is addressable as multiple rows 102. In the example of FIG. 1, each row of ROM 100 includes multiple bit fields including a pointer 104, a select value 106 (also referred to herein as "select bits"), and control output bits 108. The pointer 104 of any given row 102 can be used to address a row of ROM 200. The control output bits 108 for an addressed row 102 are used as the control output bits 115 from the state machine circuit of FIG. 1. The control output bits 115 may be used to control other hardware such as timers, counters, etc., or other electrical circuits.

ROM 200 is addressable as multiple rows 202. Each row 202 of ROM 200 includes at least one cell (e.g., cell 210a) and each cell includes mask bits 211, input compare bits 212, and next state bits (nstate) 213 as shown. Each row 202 in the example ROM 200 of FIG. 1 includes multiple cells 210a, 210b, . . . , 210n, but can include only a single cell in other implementations. The term "cell" is used herein to refer to the set of mask bits 211, input compare bits 212 and next state bits 213.

The comparator circuit 250 is coupled to ROM 200 and compares each of the input compare bits 212 from one or more or all of the cells 210a-n (collectively referred to as cells 210) to corresponding input bits 225 to the finite state machine circuit 90. In some implementations, the number of input compare bits 212 in a given cell equals the number of input bits 225, that is, there is a corresponding input bit 225 for each input compare bit 212 of a cell 210. The input bits 225 to the finite state machine circuit 90, and to the comparator circuit 250 specifically, can represent a variety of input values, e.g., counter output values, comparisons of voltages to thresholds, etc. The finite state machine circuit 90 can be sequenced under control of a clock signal (CLK) 118 from one state to the next. The next state is specified by the next state bits 213 in ROM 200 in a cell 210 which is selected by selection circuit 260 based on the current state of the finite state machine circuit 90 and the input bits 225.

In the example of FIG. 1, the comparator circuit 250 includes multiple comparators 252 (e.g., comparators 252a, 252b, . . . , 252n). Each comparator 252 compares the input compare bits 212 of a particular cell 210 in a row 202 of ROM 200 with the corresponding input bits 225 (e.g., a bit-wise comparison). The output signal 254 of each comparator comprises a match indicator. The match indicator indicates whether all of the unmasked input compare bits 212 of a given cell 210 match all of the corresponding input bits 225 to the finite state machine circuit 90. If all unmasked bits match, the match indicator is forced to one logic state (e.g., a "1"). If any of the unmasked input compare bits 212 of a given cell 210 do not match all of the corresponding input bits 225 of the finite state machine circuit 90, the match indicator is forced to the opposite logic state (e.g., a "0"). The polarity of the match signal can be different than the preceding example (e.g., 0 means all bits match and 1 means at least one bit does not match).

In FIG. 1, comparator 252a compares the input compare bits (in_0) of cell 210a to the input bits 225 to the finite state machine circuit 90 and generates a match_0 output indicator 254a as described above. Similarly, comparator 252b compares the input compare bits (in_1) of cell 210b to the input bits 225 and generates a match_1 output indicator 254a. Comparator 252n compares the input compare bits (in_n) of cell 210n to the input bits 225 and generates a match_n output indicator 254n.

In general, no more than one of the match indicators 254a-n will indicate a match between the input compare bits 212 of a given cell and the input bits 225 to the finite state machine 90. The next state bits 213 of the cell 210 for which that cell's comparator 252 generates a match indicator 254 indicative of a successful match of all bits are the next state bits that represent the next state of the finite state machine circuit. Those particular next state bits are selected via the selection circuit 260 using the match indicators 254a-n as selection control signals to the selection circuit. In some embodiments, all of the sets of next state bits 213 of the various cells are provided to the inputs of the selection circuit 260, and the one set of next state bits 213 whose comparator match signal indicates a successful match of the input bits to the input compare bits is provided through to the output of the selection circuit.

It is possible that no match indicators 254 indicate a match. This condition may be determined by logically ANDing (or NORing) all of the match indicators together via an AND (or NOR) gate (not shown) to generate a "no match" signal 265 to the selection circuit 260. An affirmative no match signal 265 causes the selection circuit 260 to continue outputting the previous next state bits (which represent the current state of the finite state machine). That is, the state of the finite state machine circuit 90 does not change.

In the example of FIG. 1, the next state output bits of the selection circuit 260 are stored in the register 120. The register is clocked by the clock signal (CLK) 118 to provide its contents (the selected next state bits) as the current state to ROM 100. The selected next state bits are used to address ROM 100 to thereby select a particular row 102. The pointer 104 in the selected row 102 of ROM 100 is used to address ROM 200 and the control output bits 108 of the selected row 102 are used as the control output bits 115 from the finite state machine circuit 90, as noted above.

For any given state of the finite state machine circuit 90, not every input bit 225 is necessarily relevant in the determination as to the next state of the finite state machine circuit. As such, each cell 210 of each row of ROM 200 includes mask bits 211, which specify which input compare bits 212 are needed to compare to the input bits 225. In one embodiment, each mask bit 211 corresponds to an input compare bit 212 and specifies whether the comparison of that particular input compare bit is or is not relevant to the determination of the next state. In other embodiments, a single mask bit may correspond to a group of input compare bits to thereby indicate whether the comparison of that particular group of input compare bits is or is not relevant to the determination of the next state. Each row 102 of ROM 100 also may include one or more select bits 106. For a given state of the finite state machine circuit 90, not every cell 210 in the selected row of ROM 200 is relevant to the determination of the next state of the finite state machine circuit. The select bits indicate which cells 210 are to be used in the next state determination and which cells are not to be considered. An example illustrating the use of the mask bits 211 and the select bits 106 in the comparator circuit 250 is shown in FIG. 2 and discussed below.

Figure 2:
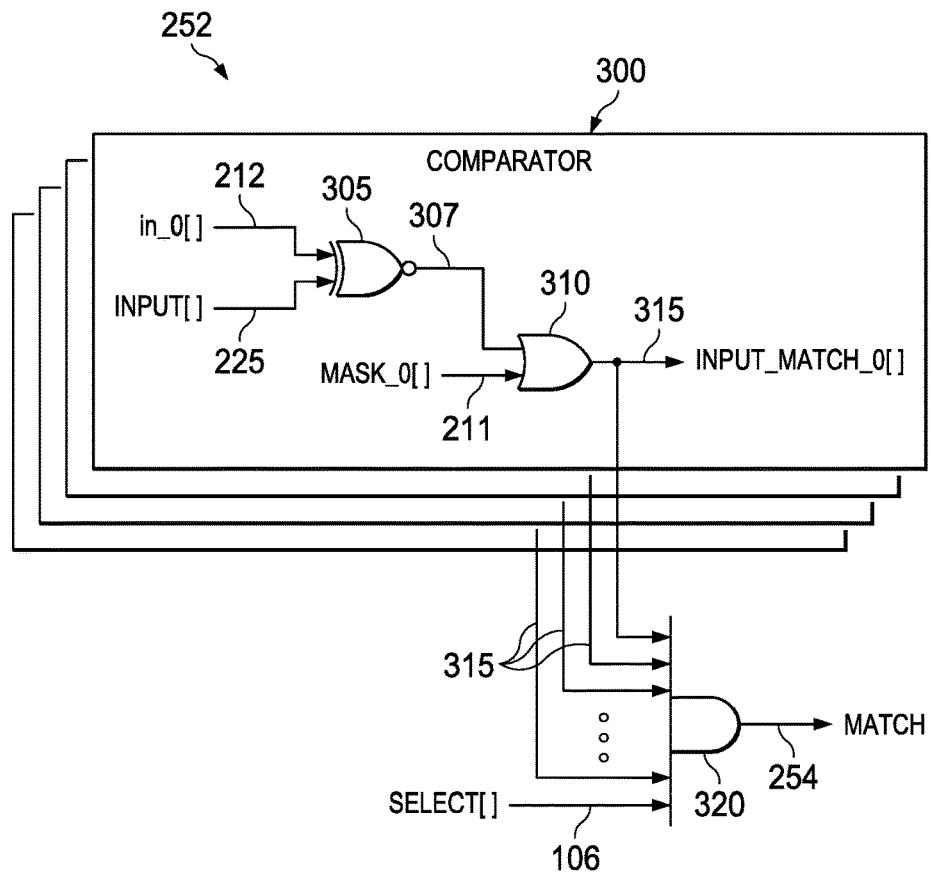
FIG. 2 shows an example of a comparator usable in the multi-ROM state machine of FIG. 1 in accordance with various examples.

FIG. 2 shows an example of one of the comparators 252 of the comparator circuit 250. In this example the comparator 252 includes multiple comparator subcircuits 300, one comparator subcircuit 300 for each input compare bit. Each comparator subcircuit 300 includes an exclusive-NOR gate 305 coupled to an OR gate 310. Inputs to the exclusive-NOR gate 305 include an input compare bit 212 and its corresponding input bit 225. The output signal 307 from the exclusive-NOR gate is a logic 1 only if both inputs are of the same polarity (both 1's or both 0's). If the inputs are of opposite polarities, the output signal 307 from the exclusive-NOR gate 305 is a logic 0.

The exclusive-NOR gate's output signal 307 is provided to an input of the OR gate 310. Another input of OR gate 310 is a mask bit 211 from the same cell that contained the input compare bit provided by the exclusive-NOR gate 305. If the mask bit is a 0, then the input_match output signal 315 from the comparator subcircuit 300 will be the same logic state as the output signal 307 from the exclusive-NOR gate 305, which indicates whether the inputs to the exclusive-NOR gate match. If the mask bit is a 1, then the input_match output signal 315 of OR gate 310 is forced to be a 1 regardless of whether the inputs to the exclusive-NOR gate match. Each comparator 252 includes a comparator subcircuit 300 for each of the input compare bits 212 and, subject to the state of a corresponding mask bit 211, the comparator's input_match output signal 315 indicates whether the input compare bit 212 matches the corresponding input bit 225. The example of FIG. 2 illustrates the comparison of input compare bit in_0 to the corresponding input bit 225, subject to the relevant mask bit mask_0 to thereby produce an input_match_0 output bit.

The various input_match signals 315 are provided to AND gate 320 and are thus logically ANDed together to produce the resulting match indicator 254 from the comparator 252. If any of the input_match signals 315 are a logic 0 (indicative of no match between an input compare bit and a corresponding input bit 225), then the match indicator 254 generated by the AND gate 320 will be a logic 0. Otherwise, if all input_match bits 315 are 1's, then the match indicator from the AND gate will be a logic 1.

The AND gate 320 in this example also includes as another input a select bit 106 from ROM 100. The select bit can be used to force the match indicator 254 to be at a logic level indicative of no match between an input compare bit and a corresponding input bit 225 regardless of the comparison between the input compare bits and corresponding input bits 225. In this example, if the select bit is a logic 0, the match indicator 254 will be forced to be a 0 as well regardless of the states of the input_match signals 315. Other implementations of the comparators 252 may include different types of logic gates and thus select bits being a logic 1 may force the match indicators 254 to be indicative of a lack of match between input bits.

Figure 3:
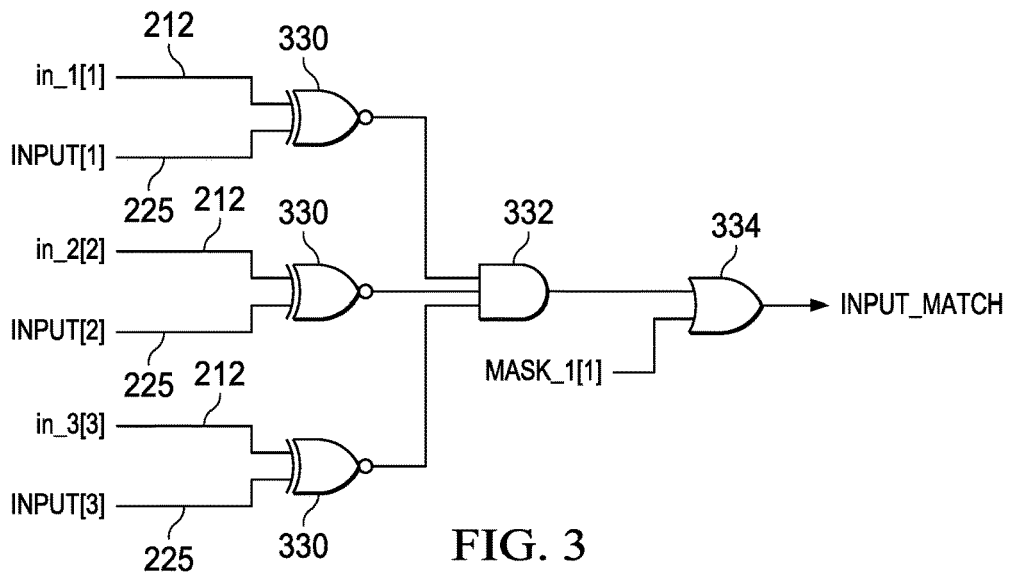
FIG. 3 shows a circuit in which one mask bit is applicable to multiple input bits.

FIG. 3 shows an example in which a given mask bit is applicable to multiple input bits. Thus, rather each mask bit corresponding to a unique input or input compare bit, a mask bit can represent the mask for multiple input bits. In this example, each of three input compare bits 212 in_1[1], in_1[2, and in_1[3] is compared to a corresponding finite state machine input bits 225 via exclusive-NOR gates 330, similar to that shown in FIG. 2. The output signals from the exclusive-NOR gates 330 are ANDed together via AND gate 332 to produce a signal indicative of whether all three input compare bits 212 match their corresponding input bits 225. The output of AND gate 332 is then provided to an input of OR gate 334, and the other OR gate input receives the mask bit (mask_1[1]) which is applicable to the three input compare bits 212. If the mask bit is a 0, then the output signal of OR gate 334 (the input_match indicator) indicates whether all three input bits successfully matched; else, if the mask bit is a 1, the input_match indicator is forced to be a 1.

Figure 4:
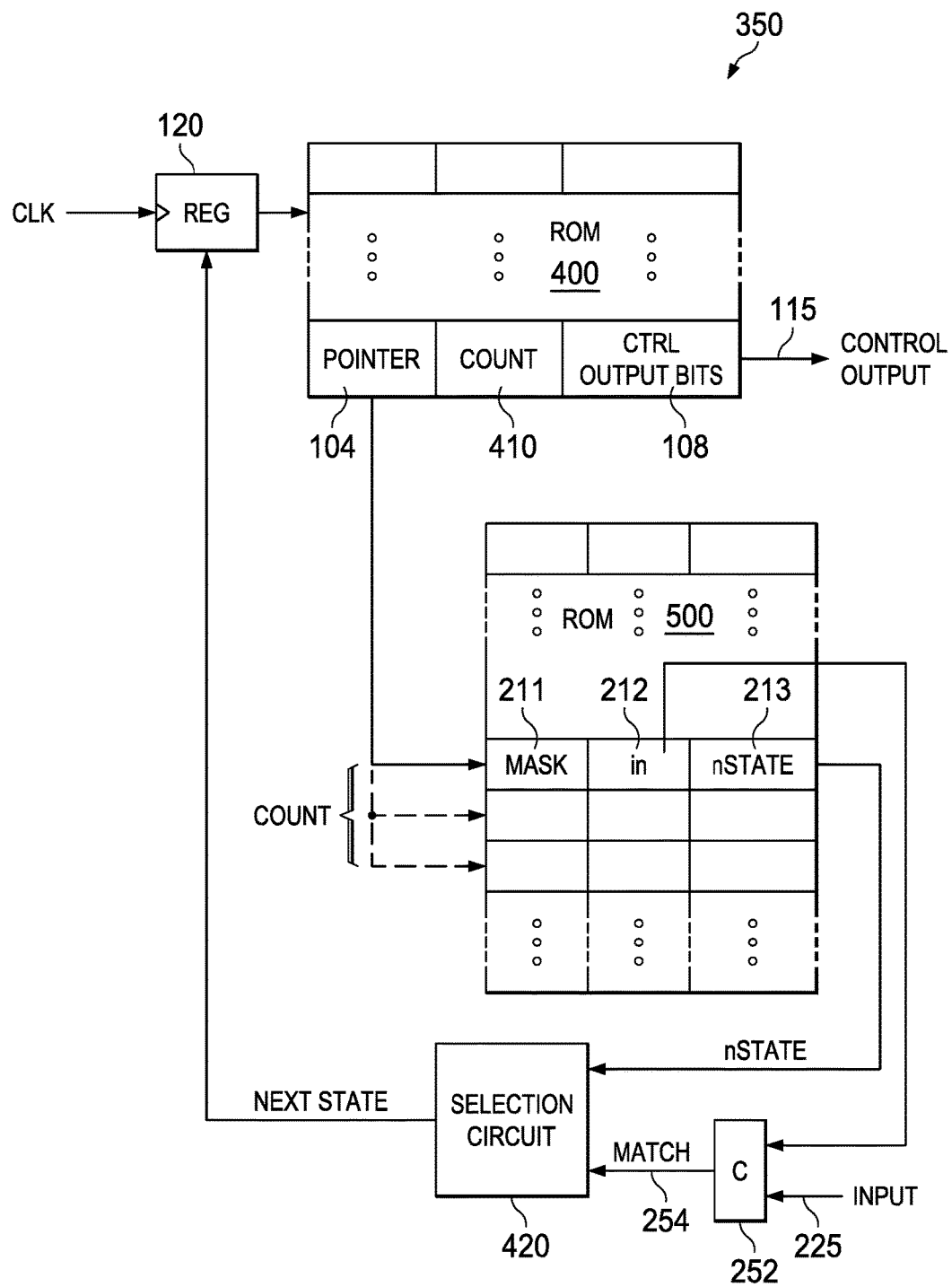
FIG. 4 shows another embodiment of a multi-ROM state machine circuit in accordance with various examples.

FIG. 4 shows another example of a multi-ROM finite state machine circuit 350. This example also includes two ROMs—ROM 400 and ROM 500. At least some of the information stored in each ROM is different than what is stored in the ROMs of FIG. 1. Each row of ROM 400 includes a pointer 104 and control output bits 108 as was the case for ROM 100 of FIG. 1. However, rather than the select value 106, ROM 400 includes a count value 410 in each row. The count value 410 represents an integer number of consecutive rows in ROM 500 that are to be analyzed during the process of comparing the input compare bits 212 to the input bits 225 to the finite state machine circuit 350.

The pointer value 104 is used to address a particular row in ROM 500. Each row in ROM 500 includes a single cell containing the mask bits 211, the input compare bits 212, and the next state bits 213. Rather than storing multiple cells in each row of ROM 500, the multiple cells used to determine the next state given the present state and the input bits 225 are stored in contiguous rows in the ROM and the count value 410 specifies the number of rows in ROM 500 following (and/or including) the row addressed by the pointer value. For example, the count value 410 may be the number "3" which means that the row to which the pointer address as well as the next two consecutive rows (as depicted by the dashed pointer lines in FIG. 3) are used to determine the rows of ROM 500 whose input compare bits 212 are to be compared to the input bits 225. A comparator 252 performs the comparison of the input compare bits 212 to the input bits 225 as described above to generate a match signal 254. A selection circuit 420 selects the next state bits 213 of the row in ROM 500 whose match signal 254 indicates a successful match of all of the corresponding input compare bits 212 to the input bits 225. The selected next state bits 213 are then clocked through register 120 and used to address ROM 400 as described in the example of FIG. 1.

In the example of FIG. 4, a single comparator 252 (which may include a comparator subcircuit 300 for each bit as shown in FIG. 2) is used and the comparison process is performed sequentially starting with the row addressed by the pointer value 104. The comparison of each row's input compare bits 212 progresses until a successful match is found or all "count" rows have been checked, whichever comes first. At that point, the comparison process may stop.

Figure 5:
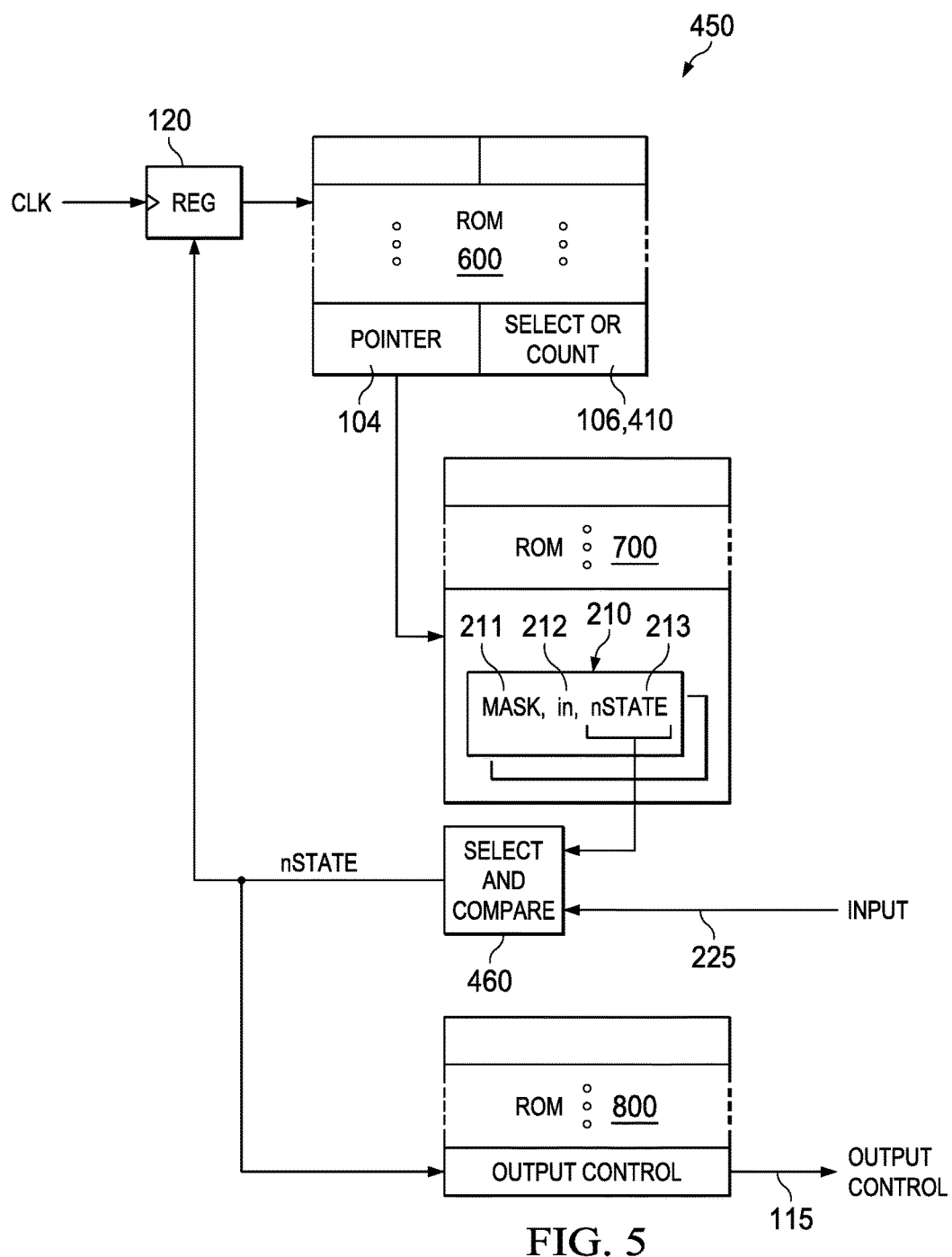
FIG. 5 shows an embodiment of a multi-ROM state machine circuit including three ROMs in accordance with various embodiments.

FIG. 5 shows another multi-ROM finite state machine circuit 450, which includes three ROMs—ROMs 600, 700, and 800. Each row of ROM 600 includes a pointer value 104 and either a select value 106 or a count value 410, the use of which may be as described above. In this example, ROM 600 does not store the control output bits, and instead ROM 800 stores the control output bits. Each row of ROM 700 stores one or more cells 210 with each cell comprising the mask bits 211, input compare bits 212, and next state bits 213 as described above. A select and compare circuit 460 may comprise the compare circuit 250 and selection circuit 260 of FIG. 1, the comparator 252 and selection circuit 420 of FIG. 4, or different or additional components. Using any of the comparison techniques described above, the select and compare circuit 460 selects the next state bits of the cell in ROM 700 whose input compare bits 212 match the finite state machine circuit's input bits 225. The selected next state bits 213 are used, via register 120, to address a row of ROM 600 as well as to address a row of ROM 800. The addressed row of ROM 800 includes the control output bits to be output by the finite state machine circuit 450.

In some embodiments, the control output bits can be stored across multiple ROMS, for example, between ROMs 100 and 200 of FIG. 1, across ROMs 400 and 500 of FIG. 4, and across any one or more of ROMs 600, 700, and 800 of FIG. 5.

Figure 6:
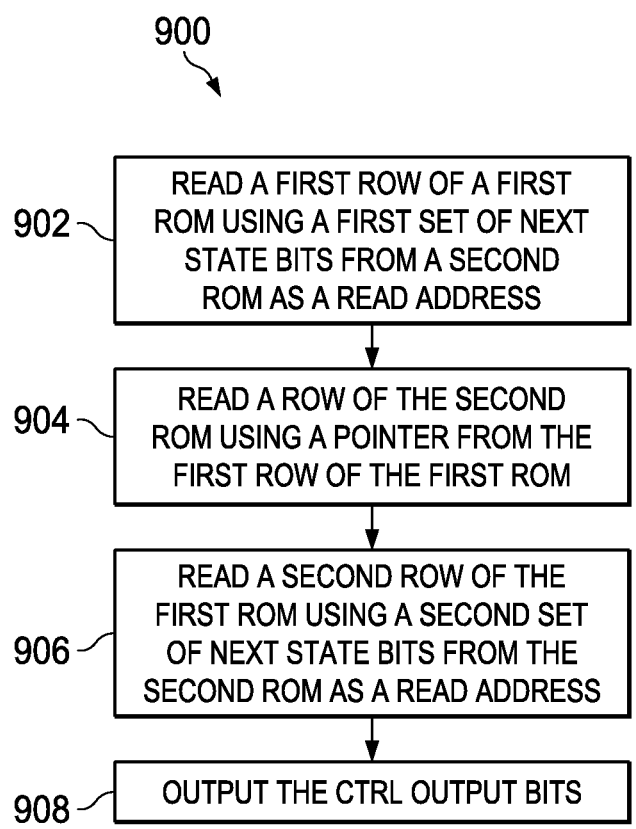
FIG. 6 shows a method in accordance with various embodiments.

FIG. 6 is a flow chart depicting an illustrative method 900 in accordance with various embodiments. The operations may be performed in the order shown, or in a different order. Further, the operations may be performed sequentially or two or more of the operations may be performed concurrently. The method may be performed by any of the finite state machine circuit embodiments described herein.

At 902, the method includes reading a first row of a first ROM (e.g., ROM 100, 400, or 600). This read transaction uses a first set of next state bits from a second ROM (e.g., ROM 200, 500, 700) as a read address. As is the case for other rows in the first ROM, the first row read from the first ROM includes a pointer to the second ROM.

At 904, the method includes reading a row of the second ROM using the pointer from the first row of the first ROM. The rows of the second ROM include next state bits. The row read from the second ROM includes a second set of next state bits. At 906, the method includes reading a second row of the first ROM. This read transaction uses the next state bits from the row of the second ROM read at 904 as a read address if the unmasked input compare bits match to the corresponding input bits 225.

At 908, the method includes outputting control output bits from the finite state machine circuit. The control output bits may be read from the first ROM as in the example of FIGS. 1 and 4 or from another ROM such as a different ROM from those mentioned in operations 902-904. In this latter case, the control output bits may be read from ROM 800 as described in FIG. 5. Alternatively, control output bits could be read from ROMs 200 (FIG. 1) or ROM 500 (FIG. 4). Further still, the output control bits may be divided between two different ROMs. Some control output bits could be stored in ROM 100 and the remaining output control bits stored in ROM 200.

As shown in FIG. 1, ROM 100 includes an address input (e.g., a row address input) that is coupled to a current state output of current state register 120. The current state output of register 120 may include a plurality of output terminals (or bits), and the address input of ROM 100 may include a plurality of address input terminals (or bits) that are each coupled to a respective one of the output terminals of register 120.

ROM 100 includes a plurality of output terminals or bits, respective subsets of which may form a pointer output, a select output, and a control output of ROM 100. The pointer output of ROM 100 is coupled to the address input of ROM 200. The pointer output of ROM 100 may include a plurality of pointer output terminals that are coupled to respective address input terminals of ROM 200.

The select value output of ROM 200 is coupled to a select value input of the comparator circuit 250. The select value output of ROM 100 may include a plurality of select value output terminals that are coupled to respective select value input terminals of comparator circuit 250. Each of the select value input terminals of comparator circuit 250 may be coupled to a select value input of a respective one of a plurality of comparators included in comparator circuit 250.

The control output of ROM 100 may form an output of the FSM circuit 90. The control output may include one or more control output bits or terminals that each correspond to a respective output bit of the FSM circuit 90.

ROM 200 includes a plurality of output terminals or bits, respective subsets of which may form one or more groups of output bits. Each group of output bits may include a mask bit sub-group, an input compare bit sub-group, and a next state bit sub-group. Each of the sub-groups of bits may correspond to one or more output terminals or bits of ROM 200. Each mask bit sub-group is coupled to a respective one or a plurality of mask bit sub-group inputs of comparator circuit 250. Each input compare bit sub-group is coupled to a respective one or a plurality of input compare sub-group inputs of comparator circuit 250. Each next state bit sub-group is coupled to a next state bit sub-group input of selection unit 260.

In some examples, as is shown in FIGS. 1 and 2, each mask bit sub-group input of comparator circuit 250 is coupled to a mask bit input of a respective one of a plurality of comparators 252 in comparator circuit 250. Each of the bits of the mask bit input for each of the comparators 252 is coupled to a mask bit input of a respective comparator subcircuit 300. Similarly, each input compare bit sub-group input of comparator circuit 250 is coupled to an input compare bit input of a respective one of a plurality of comparators 252 in comparator circuit 250. Each of the bits of the input compare bit input for each of the comparators 252 is coupled to an input compare bit input of a respective comparator cell 300.

Comparator circuit 250 includes a plurality of match outputs. Each of the match outputs may correspond to an output of a respective comparator 252 in the comparator circuit 250.

Selection circuit 260 may include a plurality of next state bit sub-group inputs, each of which may be coupled to a respective next state bit sub-group output of ROM 200. Selection circuit 260 may further include a plurality of control inputs. Each of a subset of the control inputs may be coupled to a respective match output of comparator circuit 250. Another control input may be coupled to a no match detection circuit (not shown). Selection circuit 260 may further include a next state output that is coupled to the next state input of register 120.

As shown in FIG. 4, ROM 400 includes a plurality of output terminals or bits, respective subsets of which may form a pointer output, a count value output, and a control output of ROM 400. The pointer output of ROM 400 is coupled to the address input of ROM 500. The control output of ROM 500 may form an output of the FSM circuit 350. The count value output of ROM 400 is coupled to a count input of ROM 500. ROM 500 may include read circuitry that determines a number of rows to read based on the count value received at the count input, determines which rows to read based on the determined number of rows and the address value received at the address input, and causes one or more read operations to be performed for the determined rows for reading.

ROM 500 includes a plurality of output terminals or bits that may include mask bits, input compare bits, and next state bits. The mask bits and the input compare bits are coupled, respectively, to a mask bit input and an input compare bit input of comparator 252. The next state bits are coupled to a next state input of selection circuit 420.

Certain terms are used throughout the following description and claims to refer to particular system components. Different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A multi-read only memory (ROM) state machine circuit, comprising:
   a first ROM addressable as a plurality of rows, each row including a pointer;
   a second ROM coupled to the first ROM and addressable as a plurality of rows, each row including a set of input compare bits and a next state identifier;
   a comparator circuit coupled to the second ROM, wherein the comparator circuit is configured to compare each of a plurality of input bits to the multi-ROM state machine circuit to a corresponding bit of the set of input compare bits from a row of the second ROM; and
   a register coupled to the first and second ROMs, wherein the register is configured to store next state identifiers from the second ROM based on the comparator's outputs;
   wherein, upon receipt of an edge of a clock, the stored next state identifier from the register is used as an address to read a row from the first ROM, and wherein the pointer from the first ROM row is then used as an address to read a row from the second ROM, and wherein responsive to the comparator circuit, the next state identifier corresponding to a set of input compare bits that match the input bits to the multi-ROM finite state machine circuit is stored in the register and used as an address to read another row from the first ROM.

2. The multi-ROM state machine circuit of claim 1, wherein each row in the second ROM includes a plurality of cells, each cell including input compare bits and a corresponding next state identifier.

3. The multi-ROM state machine circuit of claim 2, wherein the comparator circuit comprises a plurality of comparators, each comparator configured to compare the input compare bits of a given cell to the input bits to the multi-ROM state machine circuit to determine whether the input compare bits of the given cell match the input bits to the multi-ROM state machine.

4. The multi-ROM state machine circuit of claim 3, further comprising a selection circuit that is configured to select the next state identifier from the cell whose input compare bits match the input bits to the multi-ROM state machine circuit, the selected next state identifier clocked through the register and used as the address to read the another row from the first ROM.

5. The multi-ROM state machine circuit of claim 3, wherein each row of the first ROM also includes a set of selection bits corresponding to the cells of the rows of the second ROM, and wherein the comparator circuit is configured to:
 for at least one of the cells, generate a match signal indicative of whether all of the input compare bits of the cell match the corresponding bits of the input bits to the multi-ROM state machine circuit; and
 for at least one cell and responsive to a corresponding selection bit, force the match signal for that cell to indicate that the corresponding input compare bits do not match the input bits to the multi-ROM state machine circuit regardless of whether the corresponding input compare bits actually do match the input bits to the multi-ROM state machine circuit.

6. The multi-ROM state machine circuit of claim 1, wherein each row of the second ROM also includes mask bits, each mask bit indicating whether a corresponding input compare bit is to be used by the compare circuit to compare to a corresponding bit of the input bits to the multi-ROM state machine circuit.

7. The multi-ROM state machine circuit of claim 1, wherein each row of the first ROM also includes a count value which indicates the number of rows of the second ROM whose input compare bits are to be used by the comparator circuit to compare to the input bits of the multi-ROM state machine circuit.

8. The multi-ROM state machine circuit of claim 1, wherein each row of the first ROM includes control output bits, and wherein the control output bits of a given row of the first ROM are output by the first ROM upon that row being read using the next state identifier.

9. The multi-ROM state machine circuit of claim 1, further comprising a third ROM coupled to the second ROM, wherein the third ROM is addressable as a plurality of rows, each row of the third ROM including control output bits, and wherein the next state identifier used as an address to read the row of the first ROM is also used as an address to read a row from the third ROM to thereby access the control output bits.

10. A system, comprising:
 a multi-memory device finite state machine circuit including a first memory device, a second memory device, and a comparator circuit;
 wherein the first memory device is addressable as a plurality of rows, each row including a pointer;
 wherein the second memory device is addressable as a plurality of rows, each row including a set of input compare bits and a next state identifier;
 wherein the comparator circuit is coupled to the second memory device and is configured to compare each of a plurality of input bits to the multi-memory device state machine circuit to a corresponding bit of the set of input compare bits from the second memory device; and
 wherein, upon receipt of a clock signal, a next state identifier read from the second memory device is used as an address to read a row from the first memory device, and wherein a pointer from the first memory device row is then used to read a row from the second memory device, and wherein responsive to the comparator circuits, the next state identifier corresponding to a set of input compare bits that match the input bits to the multi-memory device finite state machine circuit is used as an address to read a row from the first memory device.

11. The system of claim 10, wherein the first and second memory devices comprise read only memories.

12. The system of claim 10, further comprising an electrical circuit coupled to the multi-memory device finite state machine circuit, wherein the rows of the first memory device include control output bits that, when read, are used to control the electrical circuit.

13. The system of claim 10, wherein each row in the second memory device includes a plurality of cells, one cell including the input compare bits and the next state identifier and the remaining cells including additional input compare bits and corresponding next state identifiers.

14. The system of claim 13, wherein the comparator circuit comprises a plurality of comparators, each comparator configured to compare the input compare bits of a given cell to the input bits to the multi-memory device state machine circuit to determine whether the input compare bits of the given cell match the input bits to the multi-memory device state machine, and wherein the system further comprises a selection circuit that is configured to select the next state identifier from the cell whose input compare bits match the input bits to the multi-memory device state machine circuit, the selected next state identifier clocked through the register and used as the address to read the row from the first memory device.

15. The system of claim 10, wherein each row of the first memory device also includes a count value which indicates the number of rows of the second device whose input compare bits are to be used by the comparator circuit to compare to the input bits of the multi-memory device state machine circuit.

16. A method, comprising:
 reading a first row of a first read only memory (ROM) using a first set of next state bits from a second ROM as a read address, the first row including a pointer to the second ROM;
 reading a row of the second ROM using the pointer from the first row of the first ROM, the row of the second ROM including a second set of next state bits; and
 reading a second row of the first ROM using the second set of next state bits from the second ROM as a read address.

17. The method of claim 16, wherein each row of the first ROM includes control output bits, and the method further includes outputting the control output bits from the first row of the first ROM upon reading the first row and outputting the control output bits from the second row of the first ROM upon reading the second row.

18. The method of claim 16, further comprising reading a row of a third ROM using the second set of next state bits from the second ROM as a read address, and outputting control output bits from the row of the third ROM.

19. The method of claim 16, wherein each row of the second ROM includes multiple sets of bits, each set of bits includes a mask, input compare bits, and next state bits, and wherein the method includes comparing at least one set of input compare bits from the row of the second ROM to input bits of a finite state machine circuit including the first and second ROMs and selecting as the next state bits to use to read the second row of the first ROM the next state bits of the cell whose input compare bits match the corresponding bits of the input bits to the finite state machine circuit.

20. The method of claim 16, wherein each row of the second ROM includes mask bits, input compare bits, and next state bits, wherein each row of the first ROM includes a count value, and wherein the method includes:
- sequentially comparing the input compare bits from the row of the second ROM, and each subsequent row defined by the count value to input bits of a finite state machine circuit including the first and second ROMs; and
- selecting as the next state bits to use to read the second row of the first ROM the next state bits of the second ROM row whose input compare bits match the corresponding bits of the input bits to the finite state machine circuit.

* * * * *